United States Patent [19]

Essinger

[11] Patent Number: 4,508,990

[45] Date of Patent: Apr. 2, 1985

[54] THIN-FILM EL PANEL MOUNTING UNIT

[75] Inventor: Walter F. Essinger, Thousand Oaks, Calif.

[73] Assignee: Sigmatron Associates, Los Angeles, Calif.

[21] Appl. No.: 419,176

[22] Filed: Sep. 17, 1982

[51] Int. Cl.³ .................. H05B 33/04; H05B 33/06; H01J 5/50; H01R 9/00

[52] U.S. Cl. .................................. 313/50; 313/51; 313/512; 361/408

[58] Field of Search .............. 313/512, 49, 50, 51; 361/395, 408, 397 (U.S. only)

[56] References Cited

U.S. PATENT DOCUMENTS

| | | | |
|---|---|---|---|
| 3,329,851 | 7/1967 | Braeutigam et al. | 313/512 |
| 3,638,033 | 1/1972 | Johnson et al. | 313/51 X |
| 3,828,215 | 8/1974 | Bilsback | 313/51 X |
| 4,088,828 | 5/1978 | Yamamoto et al. | 361/397 X |

Primary Examiner—Palmer Demeo
Attorney, Agent, or Firm—John T. Matlago

[57] ABSTRACT

A mounting unit for a thin-film EL panel includes a substrate provided with cross-grid electrodes on the back surface thereof having aligned terminals located along the marginal sides thereof and a printed circuit board provided with a plurality of conductive paths on the front surface thereof having aligned end portions located along the side portions thereof. The printed circuit board is provided with plated-through connecting holes and routing holes. Some of the conductive paths on the front surface of the printed circuit board are connected to some of the connecting holes and others of the conductive paths are connected to the routing holes. The back surface of the printed circuit board is provided with conductive paths connecting the routing holes to others of the connecting holes. Plug connectors for electrical circuit means are positioned on the back of the printed circuit board with their leads respectively connected to the connecting holes. The printed circuit board and the substrate are held together with strips of conductive elastomeric connectors sandwiched between the aligned end portions of the conductive paths on the front surface of the printed circuit board and the aligned terminals of the electrodes on the back surface of the substrate.

11 Claims, 11 Drawing Figures

THIN-FILM EL PANEL MOUNTING UNIT

BACKGROUND OF THE INVENTION

This invention relates to electroluminescent (EL) display panel devices and more particularly to such a device wherein the EL panel is readily replaceable.

It is highly desirable to provide a display device which comprises a housing having a thin-film EL panel mounted thereon. The housing contains a solid state memory and a micro-computer for controlling the transfer of data from the memory to operate the panel.

One of the problems of such a display device is that the EL panel therefor has a relatively short life and has to be replaced from time-to-time. A typical EL panel is formed by providing a first set of thin-film transparent electrodes on a glass substrate followed by thin-film layers of a first dielectric, a phosphor, a second dielectric, and a second set of thin-film electrodes positioned orthogonally to the first set. The first and second sets of electrodes thus form a crossed-grid array on the panel. A back glass cover plate for protecting the thin-film structure is then held on the substrate by a marginal seal of epoxy.

It should be appreciated that in a typical EL panel, the electrodes of each set spaced with a high linear resolution, on the order of fifty-six per inch. When using a one square inch EL panel, and providing for alternate electrodes of each set to terminate at opposite sides of the substrate, twenty-eight electrode terminals are provided along each of the four marginal sides of the panel. A panel suitable for use in the present invention is disclosed in the commonly assigned patent application of Sam H. Rustomji entitled "High Resolution Thin-Film Electroluminescent Panel" filed May 10, 1982, and bearing Ser. No. 376,572.

Since individual contact must be made by the electronic controls in the housing with each of the fifty-six electrodes in each set of electrodes on the panel, it is highly costly to provide discrete leads with bonded connections, for example, to each of the electrode terminals. Moreover, the crossed-grid array formed by the electrodes on the panel provides a large number of picture elements thereon, as many as 3136 in a square inch area. If even one of these picture elements goes out during the operation of the display device it is necessary to replace the panel. This necessitates not only the disconnecting of all one-hundred-twelve leads from the electrode terminals on the inoperable panel but the bonding of new leads to the electrode terminals on the new panel.

Another problem of such a display device is providing for protecting the phosphor layer on the panel from contact with moisture. Thus, if even a minute amount of moisture, such as inevitably present in the ambient air, works its way into the phosphor layer, through a pin hole, for example, in the thin-film structure, the picture element located at that point loses its ability to emit light when energized. It is thus desirable to provide an airtight enclosure for the thin-film structure and thus the phosphor layer on the panel. Accordingly, in the above referred to commonly assigned patent application, Ser. No. 376,572, a thin-film of alumina is sputtered over the back surface of the thin-film structure provided on the glass substrate. This thin-film of alumina is of great help in encapsulating, i.e., sealing the thin-film structure and preventing air from working its way, in time, into the phosphor layer. The marginal epoxy seal provided for the back glass cover plate also serves to help prevent ambient air from passing into the space above the thin-film structure on the substrate. However, these seals are not sufficiently airtight for this purpose resulting in the life of the phosphor layer and thereby the panel to be shortened.

OBJECTS AND SUMMARY OF THE INVENTION

Accordingly, one of the objects of the present invention is to provide a thin-film EL panel display device with a replaceable panel.

Another object of the present invention is to provide a thin-film EL panel mounting unit in which the thin-film terminals of the electrodes on the panel are electrically connected in such a manner to the contacts of plug connectors provided on the unit that in the event the panel becomes inoperable it can be easily replaced by a new one.

Still another object of the present invention is to provide a thin-film EL panel mounting unit that employs the strips of conductive elastomeric connectors that are used to electrically connect the terminals of the thin-film electrodes on the substrate of the panel to the end portions of the conductive paths formed on a printed circuit board to further help seal the thin-film structure on the substrate from contact with the ambient air.

In accordance with the present invention, the display panel mounting unit of the present invention comprises a thin-film EL panel including a glass substrate having on the back surface thereof a thin-film structure including crossed-grid electrodes formed so as to provide a row of parallel terminals on each marginal side thereof. A glass cover plate is marginally sealed by epoxy on the back surface of the substrate to protect the thin-film structure thereon. The panel is positioned with its front edges seated in a recess provided on the back of a frame support.

A printed circuit board is provided with rows of inner and outer connecting holes and a row of routing holes on each side portion thereof. Each hole is plated-through. The front surface of the printed circuit board is provided on each side portion thereof with a plurality of conductive paths having parallel end portions aligned in a row. Alternate ones of the conductive paths respectively connect to the inner connecting holes and the remaining ones of the conductive paths respectively connect to the routing holes. The back surface of the printed circuit board is provided on each side portion thereof with a plurality of conductive paths respectively connecting the routing holes to the outer connecting holes.

A plug connector is located on each side portion of the back surface of the printed circuit board. Each plug connector is provided with two rows of contacts having contact leads extending from the bottom thereof. The contact leads of the two rows of contacts are respectively inserted in the inner and outer rows of connecting holes provided on each side portion of the printed circuit board. All the holes in the printed circuit board including the routing holes are then filled with solder making them airtight.

A strip of conductive elastomeric connector having closely spaced transverse conductive layers is positioned to lie over the row of parallel terminals and adjacent the side of the back glass cover plate on each marginal side of the substrate. The printed circuit board is then attached to the back of the frame support so as to enclose the EL panel with the rows of parallel end portions of the conductive paths on the side portions of the front surface thereof held against the strips of conductive elastomeric connectors.

The strips of conductive elastomeric connectors thus provide for electrically connecting individual ones of the thin-film electrode terminals on the substrate to individual ones of the conductive paths on the printed circuit board and also provide for sealing the printed circuit board on the substrate to help prevent ambient air from working its way through the epoxy marginal seal provided for the back glass cover plate on the substrate.

BRIEF DESCRIPTION OF THE DRAWINGS

These and other objects and advantages of the present invention will appear more fully upon consideration of the illustrative embodiment shown in the accompanying drawings wherein.

DETAILED DESCRIPTION OF THE PREFERRED EMBODIMENT

Figures 1, 2, 5:
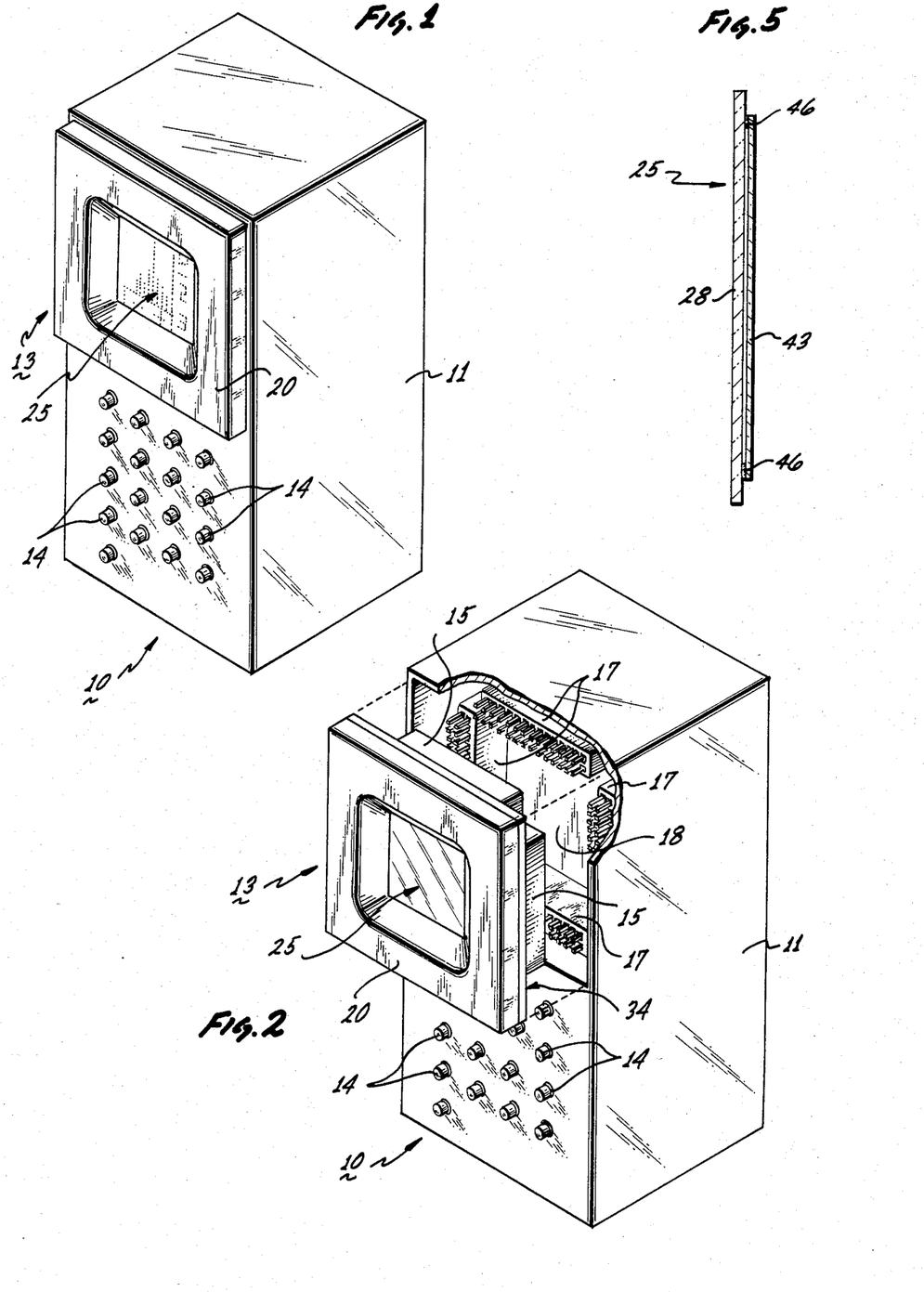
FIG. 1 is a perspective view of a display device having the thin-film EL panel mounting unit of the present invention connected on the front of the housing thereof.
FIG. 2 shows the thin-film EL panel mounting unit being disconnected from the front of the housing.
FIG. 5 is a cross-sectional view of the thin-film EL panel taken along line 5—5 of FIG. 3.

Referring to the drawings, FIG. 1 shows a display device 10 comprising a housing 11 having an EL panel mounting unit 13 connected on the front thereof. Enclosed within the housing 11 are solid state electronic circuits (not shown) comprising a micro computer and a memory unit. The memory unit stores data to be displayed on the panel under the control of the micro computer. A number of push buttons 14 are provided on the front of the housing 11 for connecting power to the circuits and selecting the various operating features of the display device.

As shown in FIG. 2, the EL panel mounting unit 13 is provided with a socket connector 15 on each of the four side portions of the rear surface thereof. In order to connect the mounting unit 13, each socket connector 15 engages a pin connector 17 provided on each of the four side portions of the front surface of a printed circuit board 18 located within the housing 11.

Figures 3, 10:
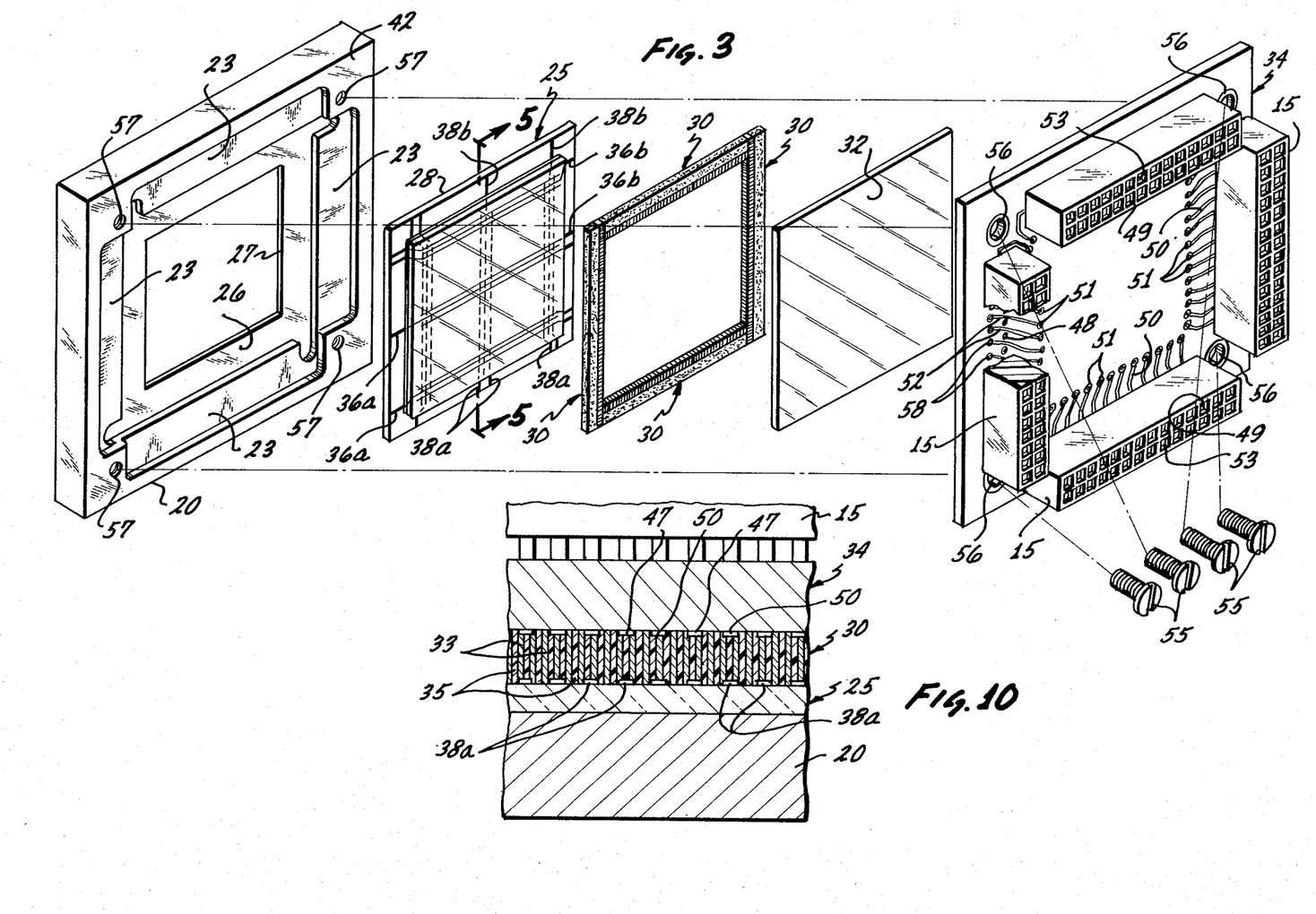
FIG. 3 is an exploded view of the components comprising the thin-film EL panel mounting unit.
FIG. 10 is an enlarged sectional view of a portion of the thin-film EL panel mounting unit shown in FIG. 9.

Reference will next be made to FIG. 3 which shows an exploded view of the components of the thin-film EL panel mounting unit 13. Mounting unit 13 comprises a metal frame support 20, an EL panel 25, four strips of conductive elastomeric connectors 30 joined at their ends to form a square arrangement, a sheet of desiccant material 32, and a printed circuit board 34 having the socket connectors 15 on the side portions of the rear surface thereof.

The metal frame support 20 is provided with a central square opening 27. The back surface 42 of the frame support 20 is formed with a recess 26 which surrounds the square opening 27. Shallower recesses 23 are formed along each of the four sides of the recess 26. Threaded blind holes 57 are provided at the four corners of the back surface 42 of the frame support 20.

Figure 4:
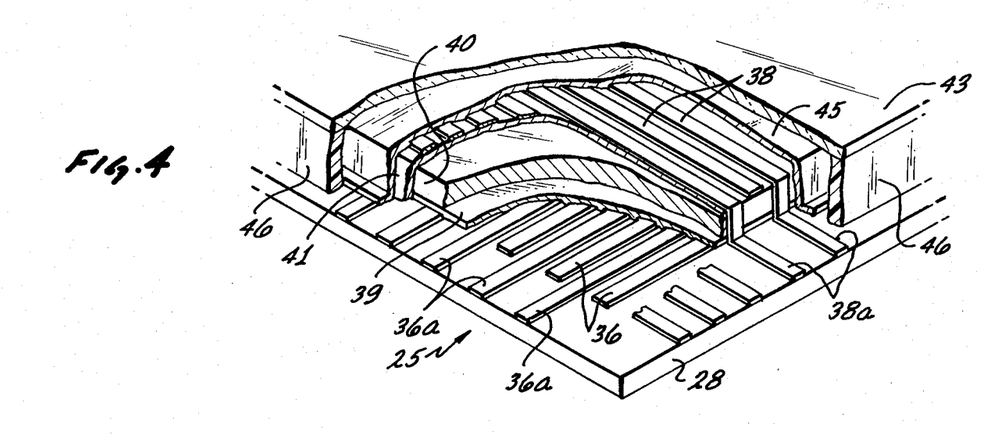
FIG. 4 is an exaggerated view showing the construction of a thin-film EL panel for use with the present invention.

Reference will next be made to FIG. 4 which shows the construction of the thin-film EL panel 25 as used in the preferred embodiment of the present invention. The EL panel has a first set of thin-film transparent electrodes 36 deposited on the back surface of a glass substrate 28 followed by deposits of a thin-film first dielectric layer 39, a phosphor layer 40, a second dielectric layer 41, and a second set of thin-film electrodes 38 positioned orthogonally to the first set. An encapsulating layer 45 is deposited by the sputtering process over the thin-film structure so formed.

As best illustrated in FIGS. 3 and 4, alternate ones of the electrodes in each set on EL panel 25 extend to opposite sides of the substrate 28. Thus, alternate ones of the electrodes 38 extend to the bottom side of the substrate 28 to form terminals 38a, and the remaining ones of the electrodes 38 extend to the top side of the substrate 38 to form terminals 38b. Likewise, alternate ones of the electrodes 36 extend to the left side of substrate 28 to form terminals 36a and the remaining ones of the electrodes 36 extend to the right side of substrate 28 to form terminals 36b. The substrate 28 is thus provided with a row of electrode terminals on all four marginal sides thereof.

A back glass cover plate 43 which is smaller in area than the substrate 28 is then centrally positioned over the thin-film structure and supported on substrate 28 so as to be slightly spaced from the encapsulating layer 45 by a marginal seal of epoxy. It should be noted that the terminals of the electrodes on each marginal side of the substrate 28 are left exposed.

The showing of the successive thin-film layers on the back surface of the substrate 28 in FIG. 4 is greatly exaggerated inasmuch as each is on the order of only 2000 to 6500 Angstrom units thick. Accordingly, the thickness of the film structure on the substrate 28 is not visible to the eye and the cross-sectional view of the EL panel 25 is more accurately depicted in FIG. 5.

Figures 6, 7, 7A, 8:
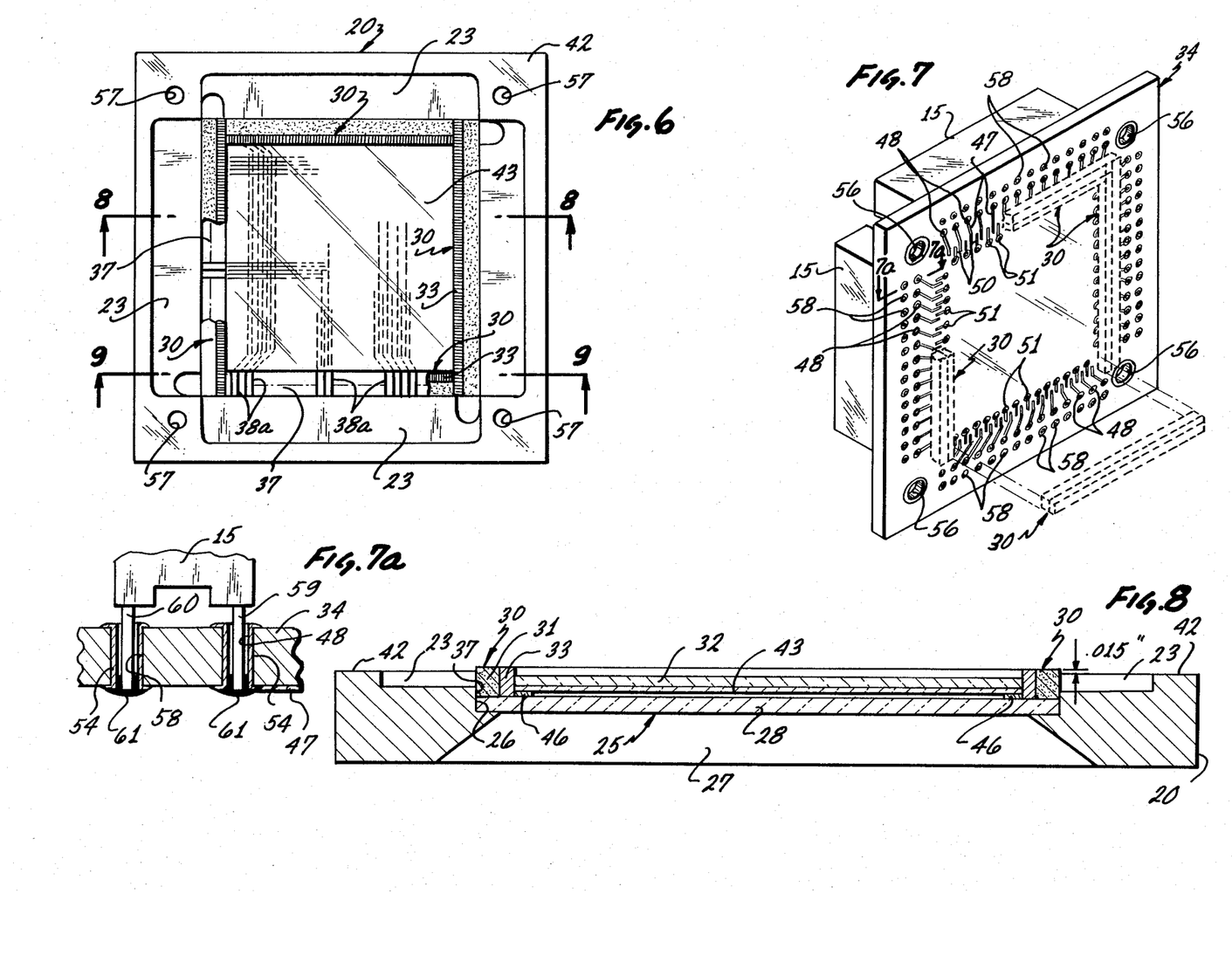
FIG. 6 is a rear view of the frame support showing the thin-film EL panel seated thereon.
FIG. 7 is a perspective view of the front of the printed circuit board.
FIG. 7a is a sectional view taken on line 7a—7a of FIG. 7 showing contact leads of a plug connector soldered to plated-through connecting holes on the printed circuit board.
FIG. 8 is a sectional view taken on line 8—8 of FIG. 6.

As shown in FIGS. 6 and 8, the EL panel 25 is placed on the rear of frame support 20 with the edges of the front side faces of its substrate 28 seated in the recess 26. When so positioned, as shown in FIG. 8, the back surface of substrate 28 lies below the surfaces of the side shallower recesses 23. As a result, grooves 37 are formed along all four marginal sides of substrate 28 by the side edges of the back glass cover plate 43 and the side edges of the recess 26, as illustrated in FIG. 6.

Figure 9:
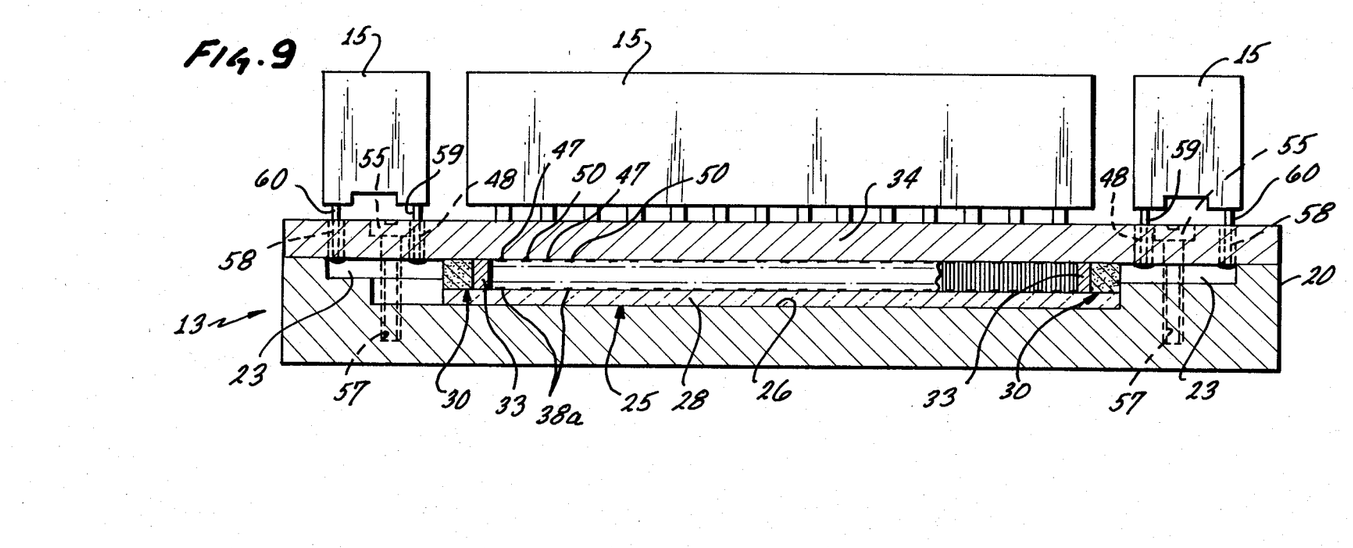
FIG. 9 is a sectional view of the thin-film EL panel mounting unit taken on line 9—9 of FIG. 6.

As best seen in FIGS. 8, 9 and 10, each strip of conductive elastomeric connector 30 comprises a body 31 having a rectangular cross-section. The body 31 is formed of an elastomer having incorporated in the inner longitudinal half-side portion between the front and back surface thereof closely spaced transversely disposed parallel conductive layers 33.

The layers 33 are formed by incorporating carbon or metal particles, for example, in the elastomer. The thin conductive layers 33 are spaced on the order of 2 to 4 mils apart and insulated from each other by layers 35 of the elastomer. The conductive elastomeric connectors 30 are commercially available as standard items on the market.

The strips of conductive elastomeric connectors 30 are inserted with a close fit in the grooves 37 formed along all four marginal sides of the substrate 28, as illustrated in FIGS. 6 and 8. Each strip of conductive elastomeric connector 30 is thus positioned when its front surface lying over the terminals provided for the electrodes on each marginal side of the substrate 28, such as terminals 38a. It should be noted in FIG. 8 that the outer or back surfaces of the strips of conductive elastomeric connectors 30 normally project approximately 0.015 inches above the back surface of the frame support 20. The sheet 32 of desiccant material is then placed on the back glass cover plate 43 of panel 25 within the cavity formed by the strips of conductive elastomeric connectors 30.

As shown in FIG. 7, each side portion of the printed circuit board 34 is provided with three rows of holes therethrough. A row of outer connecting holes 58, a row of inner connecting holes 48, and a row of routing holes 51. Each hole is plated-through to form an eyelet 54, as illustrated in FIG. 7a.

Each side portion of the front surface of printed circuit board 34 has a first group of fourteen conductive paths 47 formed thereon which are respectively connected to the eyelets of the inner connecting holes 48. The stiff input leads 59 of a first row 49 of fourteen sockets on the socket connector 15, which is positioned on the opposite surface of the printed circuit board 34, are respectively inserted through the inner connecting holes 48 and soldered to the eyelets thereof (FIG. 7a).

Each side portion of the front surface of printed circuit board 34 also has a second group of fourteen conductive paths 50 formed thereon which are respectively connected to the eyelets in routing holes 51 on the printed circuit board 34. A third group of fourteen conductive paths 52 (FIG. 3) on each side portion of the opposite surface of printed circuit board 34 then connect the eyelets on routing holes 51 to the eyelets on outer connecting holes 58. The stiff input leads 60 of a second row 53 of fourteen sockets on the socket connector 15 are, respectively, inserted through the outer connecting holes 58 and soldered to the eyelets thereof.

It should now be clearly understood that the end portions of the conductive paths 47 and 50 on the side portions of the printed circuit board 34 are interleaved and aligned to form a row. Thus, in each row, the end portions of the conductive paths 47 and 50 are positioned normal to the side edge of the printed circuit board 34 and parallel to each other with the same spacing as the electrode terminals on each marginal side of the substrate 28, such as the terminals 38a on the bottom marginal side thereof.

It should be further noted that the connecting holes 48 and 58, and also the routing holes 51, on all four side portions of the printed circuit board are filled with solder 61 (FIG. 7a) so as to make them airtight.

Now then, as seen in FIGS. 3 and 9, the printed circuit board 34 is mounted on the back of the frame support 20 by the use of screws 55 passing through holes 56 on the four corners thereof and engaging the threaded blind holes 57 on frame support 20. The shallow recesses 23 on each side of the frame support 20 provide space for the soldered ends of the input leads 59 and 60 in holes 48 and 58, respectively.

When so mounted, the end portions of conductive paths 47 and 50 formed on the front face of the printed circuit board 34 lie over the back surface of the strips of conductive elastomeric connectors 30, causing the latter to be compressed. As a result, the end portions 47 and 50 are electrically connected to alternate ones of the terminals of the electrodes on the marginal sides of the EL panel 25, such as terminals 38a, by the spaced parallel thin conductive transverse layers 33 on the intervening strips of conductive elastomeric connectors 30. Thus, as illustrated in FIG. 10, one or more conductive layers 33 connect each electrode terminal 38a to either a conductive path 47 or 50 and one or more insulating layers 35 of elastomer separate, i.e., insulate, these conductive layers from the adjacent electrode terminals and the adjacent end portions of the conductive paths.

It should now be clearly understood that when the printed circuit board 34 is assembled on the frame support 20, alternate ones of the electrode terminals on each marginal side of the EL panel 25 connect to the end portions of the conductive paths 47 on the front surface of the printed circuit board 34 which are connected to the inner row 49 of sockets on socket connector 15. Likewise, the remaining ones of the electrode terminals on each marginal side of the EL panel 25 connect to the end portions of the conductive paths 50 on the front surface of printed circuit board 34 which connect through plated-through holes 51 to conductive paths 52 on the back surface of printed circuit board 34 which are, in turn, connected to the outer row 53 of sockets on socket connector 15.

As shown on FIG. 8, prior to assembly, the strips of conductive elastomeric connectors 30 extend slightly above the back surface 42 of the frame support 20. As shown in FIG. 9, as a result of the clamping down of the printed circuit board 34 against the back surface 42 of the frame support 20 by screws 55, the strips of conductive elastomeric connectors 30 are tightly compressed between the surfaces of the substrate 28 and the printed circuit board 34. Thus, the strips of conductive elastomeric connectors 30 provide not only an electrical connection but also a seal between the surfaces of the printed circuit board 34 and the substrate 28. This latter seal is in addition to the seals already provided for the thin-film structure on the substrate 28 by the marginal epoxy 45 between the back glass cover plate 43 and the substrate 28, and the encapsulating layer 46. The sheet of desiccant material 32 lying in the cavity above the back glass cover plate 43 further assists in preventing moisture in the air therein from affecting the thin-film structure on the substrate 28. As previously discussed, such moisture can, in time, work its way into the thin-film structure and seriously affect the life of the phosphor layer of the El panel.

It should now be clearly understood that in the preferred embodiment of the present invention, the fifty-six horizontal electrodes 36 on the EL panel 25 are formed so as to provide the twenty-eight terminals 36a and 36b on the left and right sides, respectively, of the substrate 28. The fifty-six vertical electrodes 38 are likewise formed so as to provide the twenty-eight terminals 38a and 38b on the bottom and top sides, respectively, of the substrate 28.

Then, in accordance with the present invention, the twenty-eight terminals thus provided on each side of the substrate 28 are further separated by connecting fourteen, i.e., alternate ones, of those terminals by the use of the group of conductive paths 47 on the printed circuit board 34 to one row of sockets, and connecting the other fourteen terminals by the use of the other group of conductive paths 50 on the printed circuit board 34 to the other row of sockets on the socket connector 15 provided on each side of printed circuit board 34. The sockets on socket connector 15 are spaced apart so that they can be readily plugged into the pin contacts of the mating pin connector 17 provided on the printed circuit board 18 situated within the housing 11, as shown in FIG. 2.

It should now be clear that when it is necessary to replace an EL panel 25, the panel mounting unit 13 can be removed from the housing 11 by disconnecting its socket connectors 15 from pin connectors 17, as shown in FIG. 2. Then, by removing the screws 55, it is possible to lift off the printed circuit board 34 and the strips of conductive elastomeric connectors 30 from the back of the frame support 20. The EL panel 25 can then be removed and replaced by a new one. Then, by merely replacing the strips of conductive elastomeric connectors 30 and attaching the printed circuit board 34 back on the frame support 20 by the use of the screws 55, the mounting unit 13 can again be placed on the housing 11 by connecting the socket connectors 15 to the pin connectors 17 on the housing 11.

It should now be understood that the location of the connecting holes on the printed circuit board and the location of the plug connectors on the back surface thereof can vary depending on the shape of the EL panel, for example. Moreover, the number of rows of socket contacts in each plug connector may vary. Thus, although the aligned end portions of the conductive paths must be located on the front surface of the printed circuit board so as to be able to be mated with the aligned electrode terminals on the marginal edges of the substrate, the conductive paths themselves may be placed on the front surface of the printed circuit board so as to connect in the simplest manner to the connecting holes provided for receiving the stiff input leads of the socket contacts on any of the rows of contacts on any of the plug connectors. Moreover, the routing holes may be placed on the printed circuit board so as to facilitate the routing of selected ones of the conductive paths from their aligned end portions to any of the connecting holes provided for the input leads of the contacts on any of the rows of contacts on any of the plug connectors.

While the invention shown and described herein has been well adapted to fulfill the objects and advantages previously enumerated as desirable, it is to be understood that the invention is not limited to the specific features shown and described but that the means and configuration herein disclosed are susceptible of modification in form, proportion and arrangement of parts without departing from the principles involved or sacrificing any of its advantages and the invention is, therefore, claimed in embodiments of various forms all coming within the scope of the claims which follow.

What is claimed is:

1. A display panel mounting unit comprising:
    a thin-film EL display panel including a glass substrate with crossed-grid electrodes formed on the back surface thereof providing terminals having a fixed spacing on each marginal side thereof;
    a frame support having a central opening and a recess on the back thereof surrounding said opening;
    said panel positioned with its front edges seated in the recess of said frame support;
    a printed circuit board having rows of inner and outer connecting holes and a row of routing holes on each side portion thereof, each said hole being plated-through;
    each side portion of the front surface of said printed circuit board having a plurality of conductive paths with end portions having said fixed spacing, alternate ones of said conductive paths respectively connected to the inner connecting holes and the remaining ones of said conductive paths respectively connected to the routing holes;
    each said side portion of the back surface of said printed circuit board provided with a plurality of conductive paths respectively connecting each routing hole to an outer connecting hole;
    a plug connector positioned on each side portion of the back surface of said printed circuit board, each said plug connector having two rows of contacts with leads respectively connected to the rows of inner and outer connecting holes on said printed circuit board;
    a strip of conductive elastomeric connector having closely spaced transverse conductive layers therein positioned to lie over the terminals on each marginal side of the back surface of said substrate; and
    means for attaching said printed circuit board on the back of said frame support with the end portions of the conductive paths on each side portions of the front surface thereof positoned to lie over each said strip of conductive elastomeric connector.

2. A display panel mounting unit as defined in claim 1 wherein said panel includes a back glass cover plate which is supported on said substrate by a marginal seal of epoxy, said back glass cover plate leaving the terminals on the marginal sides of the back surface of the substrate exposed;
    whereby when said panel is positioned with its edges seated in the recess of the frame support grooves are formed on all four marginal sides of said panel by the sides of the recess on said frame support and the sides of the back cover plate; and
    wherein said strips of conductive elastomeric connectors are positioned to lie in the grooves over the terminals on each marginal side of said substrate.

3. A display panel mounting unit as defined in claim 1 wherein the inner and outer connecting holes and the routing holes are filled with solder so as to be airtight.

4. A display panel mounting unit as defined in claim 3 including a sheet of desiccant material positioned in the cavity formed behind said back glass cover plate by said strips of conductive elastomeric connectors.

5. A display panel mounting unit as defined in claim 3 wherein said strips of conductive elastomeric connectors normally extend beyond the back surface of said frame support and are compressed upon attaching said printed circuit board on the back surface of said frame support whereby said conductive elastomeric connectors provide not only for electrically connecting the terminals of the panel to the end portions of the conductive paths on the printed circuit board but also provide for marginally sealing the printed circuit board on the back of the substrate of said panel.

6. A display panel mounting unit comprising:
   a thin-film EL panel including a glass substrate with crossed-grid electrodes formed on the back surface thereof to provide aligned parallel terminals having a fixed spacing on marginal sides thereof;
   a frame support defining an opening and having a recess on the back thereof surrounding said opening;
   said panel having its edges seated in the recess;
   a printed circuit board having plated-through holes thereon;
   said printed circuit board having a plurality of conductive paths thereon with aligned parallel end portions having said fixed spacing on side portions of the front surface thereof;
   said conductive paths respectively connected to said plated-through holes;
   plug connectors positioned on the back of said printed circuit board, each said plug connector having contacts with input leads respectively connected to the plated-through holes on said printed circuit board;
   strips of conductive elastomeric connectors having transverse closely spaced conductive layers thereon; and
   means for attaching said printed circuit board on the back of said frame support with said strips of conductive elastomeric connectors lying between the aligned parallel end portions of the conductive paths on the side portions of the front surface of said printed circuit board and the aligned parallel terminals on the marginal sides of the back surface of said substrate.

7. A display panel mounting unit comprising:
   a thin-film EL panel including a glass substrate having crossed-grid electrodes formed on the back surface thereof with aligned parallel terminals having a fixed spacing on the marginal sides thereof;
   a frame support defining an opening and having a recess on the back thereof surrounding said opening;
   said panel positioned with its edges seated in the recess;
   a printed circuit board having plated-through connecting holes and routing holes thereon;
   said printed circuit board having a plurality of conductive paths with aligned parallel end portions having said fixed spacing on each of the side portions of the front surface thereof, some of said conductive paths respectively connected to said connecting holes and the remainder of said conductive paths connecting to said routing holes;
   said printed circuit board having a plurality of conductive paths on the back surface thereof connecting said routing holes to the remaining ones of said connecting holes;
   plug connectors positioned on the back of said printed circuit board, each said plug connector having contact leads respectively connected in a connecting hole on the printed circuit board;
   strips of conductive elastomeric connectors having closely spaced insulated transverse conductive layers therein; and
   means for attaching said printed circuit board and frame support together with said strips of elastomeric connectors lying between the aligned parallel end portions of the conductive paths on the side portions of said printed circuit board and the aligned parallel terminals on the marginal sides of said substrate.

8. A display panel mounting unit comprising:
   a thin-film EL panel including a glass substrate having crossed-grid electrodes formed on the back surface thereof and arranged to provide a row of aligned parallel terminals with a predetermined spacing on each of the marginal sides thereof;
   a frame support for said panel;
   a printed circuit board having plated-through holes thereon;
   said printed circuit board provided with a plurality of conductive paths having rows of aligned parallel end portions with said predetermined spacing on each side portion of the front surface thereof, said conductive paths respectively connected to said plated-through holes;
   plug connectors having contacts with input leads, said plug connectors positioned on the back surface of said printed circuit board with their input leads connected to said plated-through holes on said printed circuit board;
   strips of conductive elastomeric connectors having transverse closely spaced insulated conductive layers therein lying on the rows of aligned parallel terminals on the marginal sides of said substrate; and
   means for attaching said printed circuit board on the back of said frame support with the rows of aligned parallel end portions of the conductive paths on each side thereof lying over said strips of elastomeric connectors;
   whereby said strips of elastomeric connectors provide for electrically connecting individual ones of the end portions of said conductive paths on said printed circuit board to individual ones of the terminals on the marginal sides of the substrate of said panel.

9. A display panel mounting unit comprising:
   an EL display panel including a glass substrate having a thin-film structure including a phosphor layer and crossed-grid electrodes formed on the back surface thereof, said electrodes arranged to provide aligned parallel terminals having a fixed spacing on the marginal sides thereof;
   a frame support for retaining said panel;
   a printed circuit board having a plurality of plated-through holes and having a plurality of conductive paths with aligned parallel end portions having said fixed spacing on each side portion of the front surface thereof, said conductive paths respectively connected to said plated-through holes;
   a plurality of plug connectors on the back surface of said printed circuit board, each said plug connector having contacts with input leads respectively inserted in a plated-through hole on said printed circuit board, said plated-through holes being filled with solder to render them airtight;
   strips of conductive elastomeric connectors having closely spaced transverse conductive layers therein lying on the aligned parallel terminals on the marginal sides of said substrate; and
   means for attaching said printed circuit board on said frame support with the aligned parallel end portions of the conductive paths on each side portion thereof lying on said strips of conductive elastomeric connectors;

whereby said conductive elastomeric connectors provide for electrically connecting individual ones of the terminals on the substrate of said panel to individual ones of the conductive paths on said printed circuit board; and whereby said conductive elastomeric connectors further provide for marginally sealing said printed circuit board on said substrate to thereby aid in preventing ambient air from working its way into said phosphor layer on said substrate.

10. A display panel mounting unit comprising:

a thin-film EL panel including a glass substrate having crossed-grid electrodes formed on the back surface thereof with aligned parallel terminals having a fixed spacing on the marginal sides thereof;

a printed circuit board having plated-through holes thereon;

said printed circuit board having a plurality of conductive paths thereon with aligned parallel end portions having said fixed spacing on the side portions of the front surface thereof;

said conductive paths respectively connected to said plated-through holes;

plug connectors for electrical circuit means positioned on the back of said printed circuit board, each said plug connector having leads respectively connected to said plated-through holes;

strips of conductive elastomeric connectors having transverse closely spaced conductive layers thereon; and means for holding said printed circuit board and said substrate together with said strips of conductive elastomeric connectors sandwiched between the aligned parallel end portions of the conductive paths on the side portions of the front surface of said printed circuit board and the aligned parallel terminals on the marginal sides of the back surface of said substrate.

11. A display panel mounting unit comprising:

a thin-film EL display panel including a glass substrate provided with crossed-grid electrodes on the back surface thereof having aligned terminals with a fixed spacing on the marginal sides thereof;

a printed circuit board provided with plated-through connecting holes and routing holes;

the front surface of said printed circuit board provided with a plurality of conductive paths having aligned end portions with said fixed spacing on the side portions thereof, some of said conductive paths connected to some of said connecting holes and others of said conductive paths connected to said routing holes;

the back surface of said printed circuit board provided with a plurality of conductive paths connecting said routing holes to others of said connecting holes;

plug connectors for electrical circuit means positioned on the back of said printed circuit board, said plug connectors having leads connected to said connecting holes;

strips of elastomeric connectors having closely spaced transverse conductive layers thereon; and means for holding said printed circuit board and said substrate together with said strips of elastomeric connectors sandwiched between the aligned end portions of the conductive paths on the side portions of the front surface of said printed circuit board and the aligned terminals on the marginal sides of the back surface of said substrate.

* * * * *